(12) United States Patent
Boettiger et al.

(10) Patent No.: US 7,218,452 B2
(45) Date of Patent: May 15, 2007

(54) CONTROLLING LENS SHAPE IN A MICROLENS ARRAY

(75) Inventors: Ulrich C. Boettiger, Boise, ID (US); Jin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/384,359

(22) Filed: Mar. 21, 2006

(65) Prior Publication Data

US 2006/0176566 A1 Aug. 10, 2006

Related U.S. Application Data

(63) Continuation of application No. 10/899,009, filed on Jul. 27, 2004, now Pat. No. 7,068,432.

(51) Int. Cl.
*G02B 27/10* (2006.01)
*H01L 27/00* (2006.01)
*H01L 21/00* (2006.01)

(52) U.S. Cl. .................. 359/619; 359/621; 250/208.1; 438/69

(58) Field of Classification Search ................ 359/619, 359/621, 626; 250/208.1, 214.1; 257/232, 257/233, 225, 292, 432, 294, 428; 348/272, 348/340; 438/69, 70, 75, 151
See application file for complete search history.

(56) References Cited

U.S. PATENT DOCUMENTS

| | | | |
|---|---|---|---|
| 5,439,621 A * | 8/1995 | Hoopman | .................... 264/2.5 |
| 5,534,720 A | 7/1996 | Song et al. | |
| 5,672,519 A | 9/1997 | Song et al. | |
| 5,718,830 A | 2/1998 | Hlinka et al. | |
| 6,157,017 A * | 12/2000 | Kim | ......................... 250/208.1 |
| 6,221,687 B1 | 4/2001 | Abramovich | |
| 6,362,498 B2 | 3/2002 | Abramovich | |
| 6,495,813 B1 * | 12/2002 | Fan et al. | ................. 250/208.1 |
| 6,821,810 B1 * | 11/2004 | Hsiao et al. | ................... 438/69 |
| 6,940,654 B1 | 9/2005 | Tang | |
| 7,009,772 B2 * | 3/2006 | Hsiao et al. | ................. 359/619 |
| 2001/0010952 A1 | 8/2001 | Abramovich | |
| 2004/0146807 A1 | 7/2004 | Lee et al. | |
| 2004/0156112 A1 | 8/2004 | Nakajima | |
| 2005/0041296 A1 | 2/2005 | Hsiao et al. | |
| 2005/0181311 A1 | 8/2005 | Nakajima | |

* cited by examiner

*Primary Examiner*—Loha Ben
(74) *Attorney, Agent, or Firm*—Dickstein Shapiro LLP (57) ABSTRACT

A semi-conductor based imager includes a microlens array having microlenses with modified focal characteristics. The microlenses are made of a microlens material, the melting properties of which are selectively modified to obtain different shapes after a reflow process. Selected microlenses, or portions of each microlens, are modified, by exposure to ultraviolet light, for example, to control the microlens shape produced by reflow melting. Controlling the microlens shape allows for modification of the focal characteristics of selected microlenses in the microlens array.

7 Claims, 10 Drawing Sheets

CONTROLLING LENS SHAPE IN A MICROLENS ARRAY

CROSS-REFERENCE TO RELATED APPLICATIONS

This application is a continuation of application Ser. No. 10/899,009 filed Jul. 27, 2004 now U.S. Pat. No. 7,068,432, which is incorporated herein by reference in its entirety.

FIELD OF THE INVENTION

The present invention relates generally to a microlens array for use in a solid-state image sensor and in particular to a microlens array and manufacturing process in which the shape of the microlenses across the array is controlled using patterned exposure to radiation.

BACKGROUND OF THE INVENTION

Solid-state image sensors, also known as imagers, were developed in the late 1960s and early 1970s primarily for television image acquisition, transmission, and display. An imager absorbs incident radiation of a particular wavelength (such as optical photons, x-rays, or the like) and generates an electrical signal corresponding to the absorbed radiation. There are a number of different types of semiconductor-based imagers, including charge coupled devices (CCDs), photodiode arrays, charge injection devices (CIDs), hybrid focal plane arrays, and complementary metal oxide semiconductor (CMOS) imagers. Current applications of solid-state imagers include cameras, scanners, machine vision systems, vehicle navigation systems, video telephones, computer input devices, surveillance systems, auto focus systems, star trackers, motion detector systems, image stabilization systems, and data compression systems for high-definition television.

Solid-state imagers typically consist of an array of pixel cells. Each pixel cell contains a photosensor that produces a signal corresponding to the intensity of light impinging on the photosensor. When an image is focused on the array of pixel cells, the combined signals may be used, for example, to display a corresponding image on a monitor or otherwise used to provide information about the optical image. The photosensors are typically phototransistors, photoconductors or photodiodes, in which the conductivity of the photosensor or the charge stored in a diffusion region corresponds to the intensity of light impinging on the photosensor. The magnitude of the signal produced by each pixel, therefore, is proportional to the amount of light impinging on the photosensor.

It is known in the art to use a microlens array with an imager pixel array. The microlens array typically includes a plano-convex microlens for each pixel. The microlenses focus incident radiation onto respective photosensors, thereby increasing the amount of light energy impinging on each photosensor. Other uses of microlens arrays include intensifying illuminating light on the pixels of a nonluminescent display device, such as a liquid crystal display device, to increase the brightness of the display, forming an image to be printed in a liquid crystal or light emitting diode printer, and coupling a luminescent device or a receptive device to an optical fiber as a focusing means.

Microlens arrays typically are formed by photolithographic patterning of a microlens material, such as a photoresist, into an array of microlens blocks. The microlenses may be separated from one another by troughs. The array of microlens blocks is subjected to a reflow process in which heat at temperatures of about 150° C.–170° C., for example, is applied to the microlens blocks for about 120 seconds. During the reflow process, the microlens block material melts, and the microlens blocks assume a curved, plano-convex lens shape. The height of the lenses is typically on the order of 3 µm or less. Further processing of the reflowed microlenses can include baking and packaging.

Prior to the reflow step, the microlens arrays can undergo a bleaching, or curing, process. Bleaching can prevent degradation of the microlenses when exposed to higher temperatures and improve transmissivity. The bleaching process may include a quick bleach step on the order of 5 to 10 seconds. Such bleaching typically is done using blanket exposure to ultraviolet (UV) radiation. Ultraviolet (UV) wavelength radiation that produces wavelengths of 350 nm to 430 nm can be used. UV radiation having wavelengths greater than 350 nm is very effective in removing photoactive material from the photoresist material. The photoactive material is believed to be responsible for some yellowing, transmissivity loss, and heat instability.

Generally, microlens arrays used for focusing light onto a pixel array are equipped with a color filter, such as a Bayer filter, whereby respective pixels of the pixel array collect light of specified wavelengths. Thus, some of the pixels collect green light, while others collect red, and the remaining pixels collect blue light. Pixel arrays generally are formed in a silicon-based substrate. Incident light penetrates into the substrate to various depths, depending on wavelength. It would be useful to optimize the focal point of each microlens on the basis of color, so as to optimize the performance of each pixel cell.

In addition, despite the use of microlens arrays, a large amount of incident light is not directed efficiently onto the photosensors due to the geometry of the microlens array. In some applications, for example, the imager receives incident light that has been focused initially by a lens, as is currently done in a cellular telephone camera application. Due to size constraints, the camera lens is often mounted in close proximity to the imager. In order to provide a focused image to the imager, light from the camera lens must spread across an area significantly wider than that of the camera lens. Consequently, light from the camera lens to the imager fans out at a wide angle. Light that strikes imager pixels directly in line with the camera lens does so in a direction substantially parallel to the axis of each microlens (normal to front of the imager pixel). Light directed toward imager pixels along the periphery of the microlens array, however, impinges on the pixels at an indirect angle that is significantly different from the parallel direction, and consequently is more scattered than centrally-directed light. As a result, the ability of a photosensor array to accurately reproduce an image varies between pixels across the array. It would be useful to adjust the focal angle of the microlenses in the array that are located toward the periphery so that more of the incident light is directed toward the respective photosensor of each pixel, thereby providing a more uniform response across the array.

There is needed, therefore, a method of fabricating microlens arrays having an improved ability to control the focusing characteristics of microlenses across the array. Microlens arrays having varying focusing patterns formed on each microlens, or various focusing pattern characteristics across the array, is also desirable. In addition, it would be advantageous to be able to control the shape and focal characteristics of microlenses individually in order to reduce crosstalk between pixels and to maximize the quantum efficiency of each pixel.

BRIEF SUMMARY OF THE INVENTION

According to the present invention, the shape of each microlens in an array is controlled using patterned bleaching of microlens material prior to a reflow process. Bleaching, typically applied as ultraviolet (UV) radiation, modifies the melting response of the microlens material. The patterned bleaching process subjects different portions of each microlens, or different microlenses across the array, to dissimilar amounts and patterns of radiation. During reflow, the microlens material melts differently depending on the exposure pattern. Thus, after reflow, the array is formed with lenses having shapes that are influenced by the application of the bleaching radiation. The shapes of the microlenses are influenced to control focal characteristics of the microlenses. The array can include a plurality of microlenses each having an identically-patterned focal characteristic, or the focal characteristics of the microlenses can vary across the array.

BRIEF DESCRIPTION OF THE DRAWINGS

The foregoing and other advantages and features of the invention will become more apparent from the detailed description of the exemplary embodiments provided below with reference to the accompanying drawings, in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" or "substrate," as used herein, are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide, or other semiconductors.

The term "pixel," as used herein, refers to a photo-element unit cell containing a photosensor device and associated structures for converting photons to an electrical signal.

Finally, while the invention is described with reference to a semiconductor-based imager, such as a CMOS imager, it should be appreciated that the invention may be applied in any micro-electronic or micro-optical device that requires high quality microlenses for optimized performance. Additional exemplary micro-optical devices which can employ the invention include CCD imaging and display devices, as well as others.

As an example of identically-patterned focal characteristics, described in more detail below, the microlenses can be patterned to provide a more spherical shape to each lens. As examples of varying the focal characteristics across the array, the symmetries of the lenses can vary, producing a variety of focus angles across the microlens array, or the focal length of the lenses can vary across the array, in a predetermined pattern.

As described below in more detail, the focal characteristics of the microlens arrays are controlled by patterned bleaching of a microlens array prior to reflow, after microlens blocks, for example, have been patterned using a resist. The patterned microlens material is exposed to a bleaching source. The radiation produced by the bleaching source is patterned at least once using a photomask or reticle, for example. The reticle causes bleaching radiation to be applied in uniform patterns for each lens, or in variable patterns across the microlens array. Fabrication of the microlens array continues with a reflow process designed to produce microlenses exhibiting shape characteristics imparted by the patterned bleaching process, taking into account how the rate of reflow melting for each lens or each part of the lens has been altered by the patterned bleaching process. Subsequent processing, such as baking and packaging, takes place according to standard industry practice.

Figure 1:
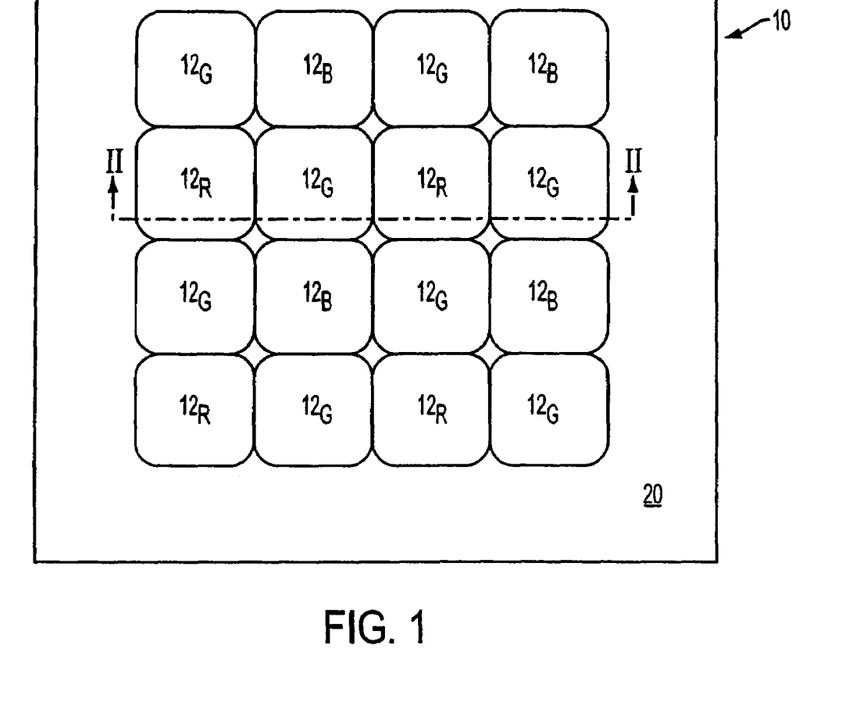
FIG. 1 is a plan view of a microlens array according to an exemplary embodiment of the present invention.

Referring to FIG. 1, an array of microlenses 10 is shown. The array 10 includes first microlenses $12_G$, second microlenses $12_B$, and third microlenses $12_R$, formed on a substrate 20. The first microlenses $12_G$ are formed for green color pixels, the second microlenses $12_B$ are formed for blue color pixels, and the third microlenses $12_R$ are formed for red color pixels.

Microlenses $12_G$, $12_B$, and $12_R$ are shaped to have different focal lengths corresponding to their respective color signal. As is known in the art, light at different wavelengths is absorbed at different depths within a photosensor. Therefore, microlenses $12_G$, $12_B$, and $12_R$ have focal lengths optimized for the wavelength of light to be detected, e.g., green, blue, and red, respectively. For example, microlenses $12_B$ can be shaped to have a focal length corresponding to approximately a top surface of an underlying photosensor, microlenses $12_R$ can be formed having a focal length corresponding to a greater depth within an underlying photosensor, for example, approximately between 2 micrometers (μm) to 3 μm deep, and microlenses $12_G$ can be formed having a focal length corresponding to an intermediate depth within an underlying photosensor, between the focal length of microlenses $12_B$ and $12_R$.

Figure 2:
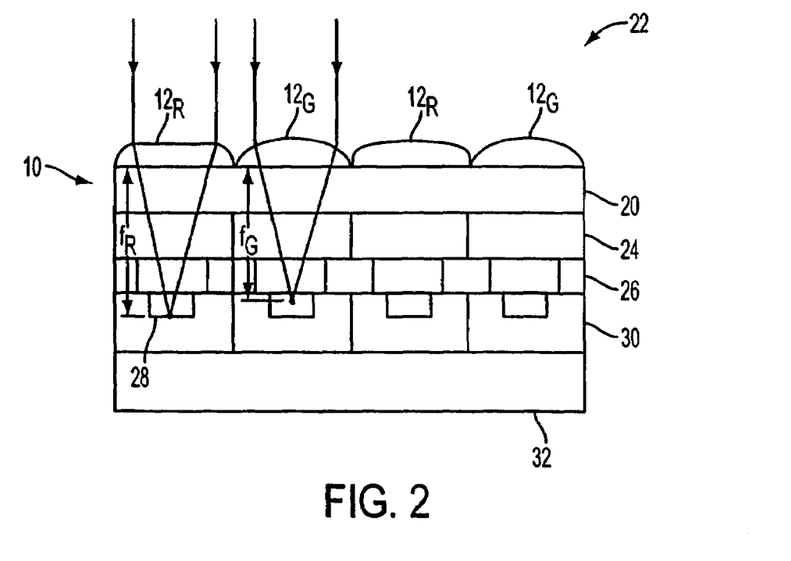
FIG. 2 is a cross-section of an imaging array according to an exemplary embodiment of the present invention.

Referring to FIG. 2, a portion of a semiconductor-based imager 22 is shown in cross-section. The imager 22 includes the microlens array 10, shown in a cross-section taken along the line II—II in FIG. 1, with the microlenses $12_G$, $12_B$ (not shown), and $12_R$, the substrate 20, a color filter array 24, a light shield 26, and pixel cells 30 embedded within a wafer 32. Each pixel cell 30 includes a photosensor 28. As shown in FIG. 2, the microlenses $12_G$, $12_R$ are shaped and configured so that their focal lengths $f_G$, $f_R$ correspond to the penetration depth of green and red wavelengths of light, respectively. Although not shown in FIG. 2, blue color microlenses $12_B$ are similarly configured to have corresponding focal lengths $f_B$.

Figure 3:
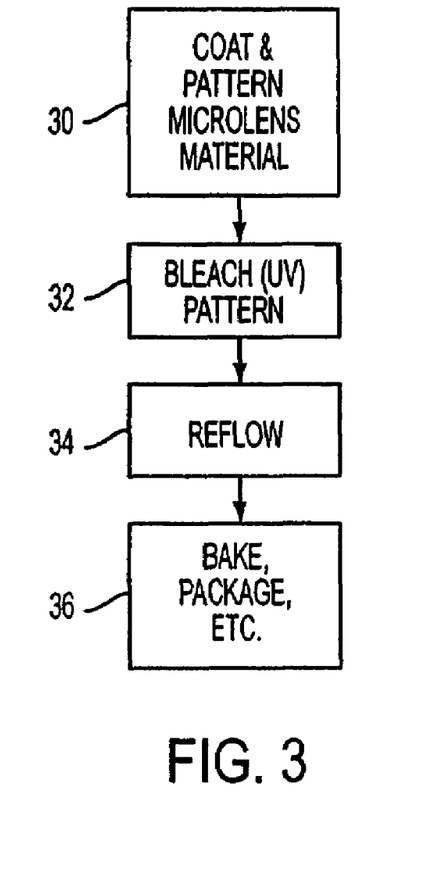
FIG. 3 is a flow diagram illustrating a method according to an exemplary embodiment of the present invention.

A method of controlling the focal characteristics of microlenses in a microlens array is illustrated in the flow diagram of FIG. 3. The method includes coating and patterning (step 30) a photoresist to form an array of microlens material, exposing (step 32) the microlens material to a bleaching source using a patterned photomask or reticle, and reflowing (step 34) the microlens material to form a microlens array. Subsequent fabrication steps include baking, for hardness, and packaging (step 36).

Figure 4:
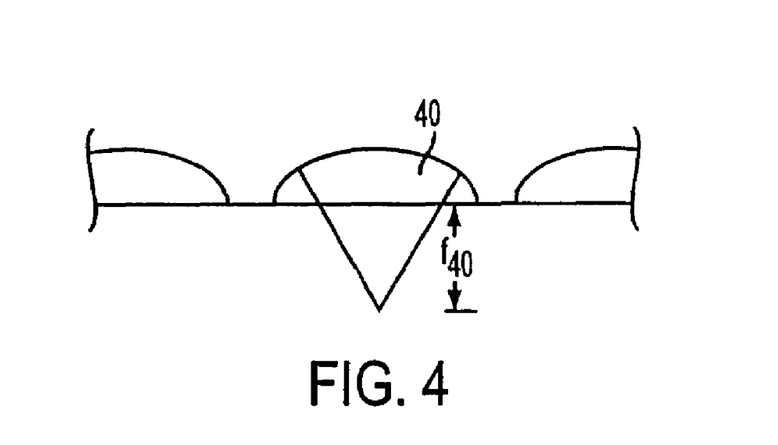
FIG. 4 is a cross-sectional elevation illustrating an unbleached microlens array after reflow.

Bleaching, typically by exposure to ultraviolet (UV) radiation, modifies the reflow response of microlens materials. An exemplary microlens material is a photoresist such as MFR-401, manufactured by Japan Synthetic Rubber Company. FIG. 4 illustrates the general reflow response of a microlens 40 made of unbleached microlens material. Microlens 40 is shown as part of a cross-sectional portion of a microlens array. The unbleached microlens material attains a plano-convex post-reflow lens having a generally circular profile; each microlens 40 in the array has a radius on the order of 3 μm or less. The lens 40 has a focal length $f_{40}$.

Figure 5:
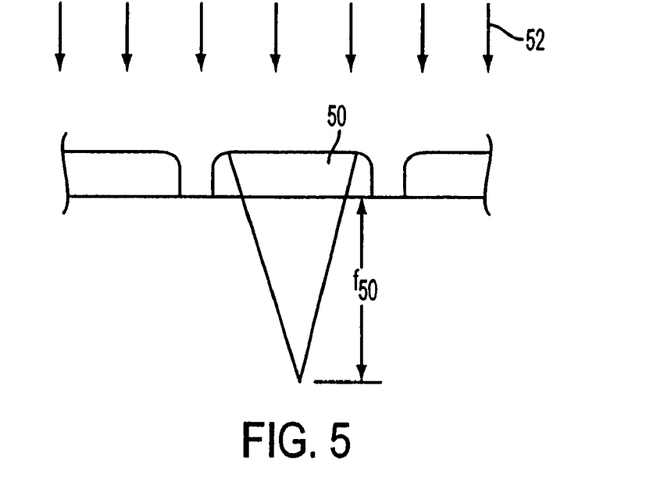
FIG. 5 is a cross-sectional elevation illustrating a blanket bleached microlens array after reflow.

FIG. 5 illustrates a post-reflow microlens 50 made of a microlens material that has been modified by a blanket bleaching process. Bleaching of the microlens material by UV radiation, represented by arrows 52, reduces the amount of melting which takes place during reflow. As a result, microlens 50 has a flatter, more rectangular profile than microlens 40, and consequently a longer focal length $f_{50}$ than focal length $f_{40}$ of microlens 40.

As can be seen by comparing FIGS. 4 and 5, the bleached microlens material of the lens 50 does not melt during reflow as much as the unbleached microlens material of lens 40. Various parameters in the reflow process can be adjusted as required to achieve a desired shape, including adjusting the UV radiation level, the time of exposure, and the portions of the pre-reflow microlens being exposed to the bleaching radiation. As a result, the shape, and consequently the focal characteristics, of the microlenses can be controlled by bleaching the microlens material prior to reflow.

Figure 6:
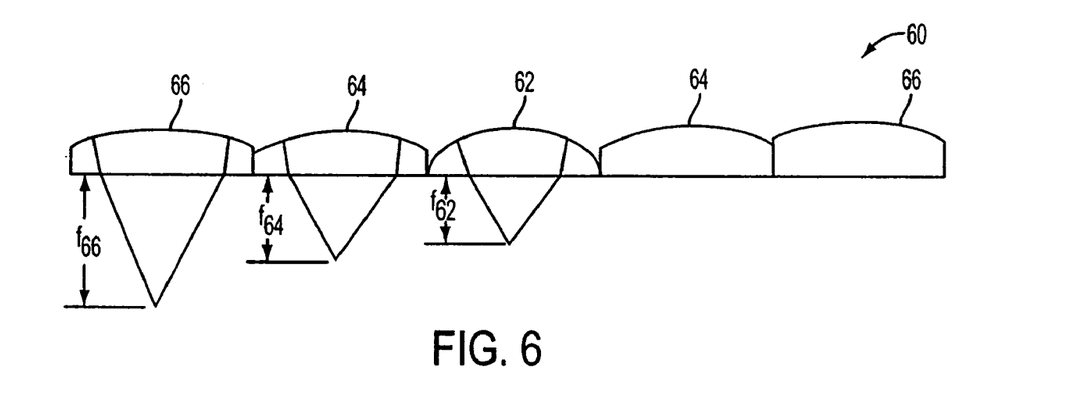
FIG. 6 is a cross-sectional elevation of a pattern bleached microlens array featuring microlenses having varying shapes and focal lengths according to an exemplary embodiment of the present invention.

FIG. 6 illustrates a microlens array 60 including a central lens 62, and intermediate and peripheral lenses 64, 66. The central lens 62 has been formed by reflowing an unbleached microlens material, and has a focal length $f_{62}$. The intermediates lenses 64 and the peripheral lenses 66 have been formed by reflowing bleached microlens material, and hence have longer focal lengths $f_{64}$ and $f_{66}$ than the focal length $f_{62}$ of the central lens 62. Further, the pre-reflow microlens material for the intermediate lenses 64 received a reduced application of bleaching radiation as compared to the pre-reflow microlens material of the peripheral lenses 66. Consequently, the focal length $f_{64}$ of intermediate lens 64 is shorter than the focal length $f_{66}$ of peripheral lens 66. As a result, the illustrated microlens array 60 features microlenses in which the focal lengths increase with distance away from the center of the microlens array.

Figure 7:
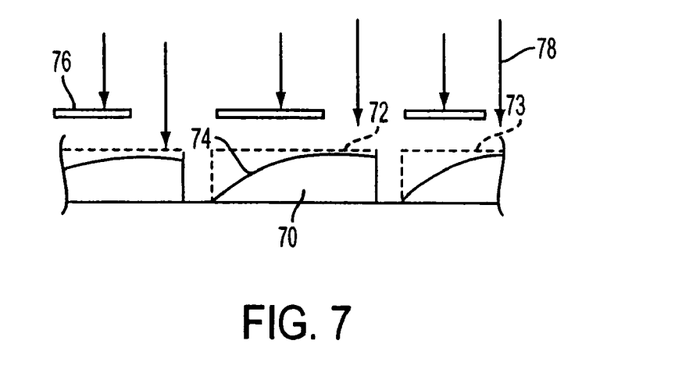
FIG. 7 is a cross-sectional elevation of a patterned half-bleached microlens array after reflow according to an exemplary embodiment of the present invention.

In FIGS. 4–6, the shapes of the microlenses 40, 50, 62, 64, 66 were controlled to establish the respective focal lengths $f_{40}$, $f_{50}$, $f_{62}$, $f_{64}$, $f_{66}$ of the microlenses. Referring to FIG. 7, the focal angle of a microlens also can be modified by bleaching. FIG. 7 illustrates an array of microlenses 70 in which one side 72 of the pre-reflow microlens material 73 (indicated by broken lines) has been bleached, while the remaining side 74 has been left unbleached. Bleaching is controlled using a reticle 76 that has openings allowing UV radiation 78 to expose the bleached side 72 of microlenses 70 prior to reflow. The bleached side 72 exhibits less melting during the reflow process, as compared to the unbleached side 74, which exhibits more melting and a significant change in shape. The resulting microlens 70 focuses incident light at an angle off-axis, tilted away from the central axis of the microlens, as shown in FIG. 8.

Figure 8:
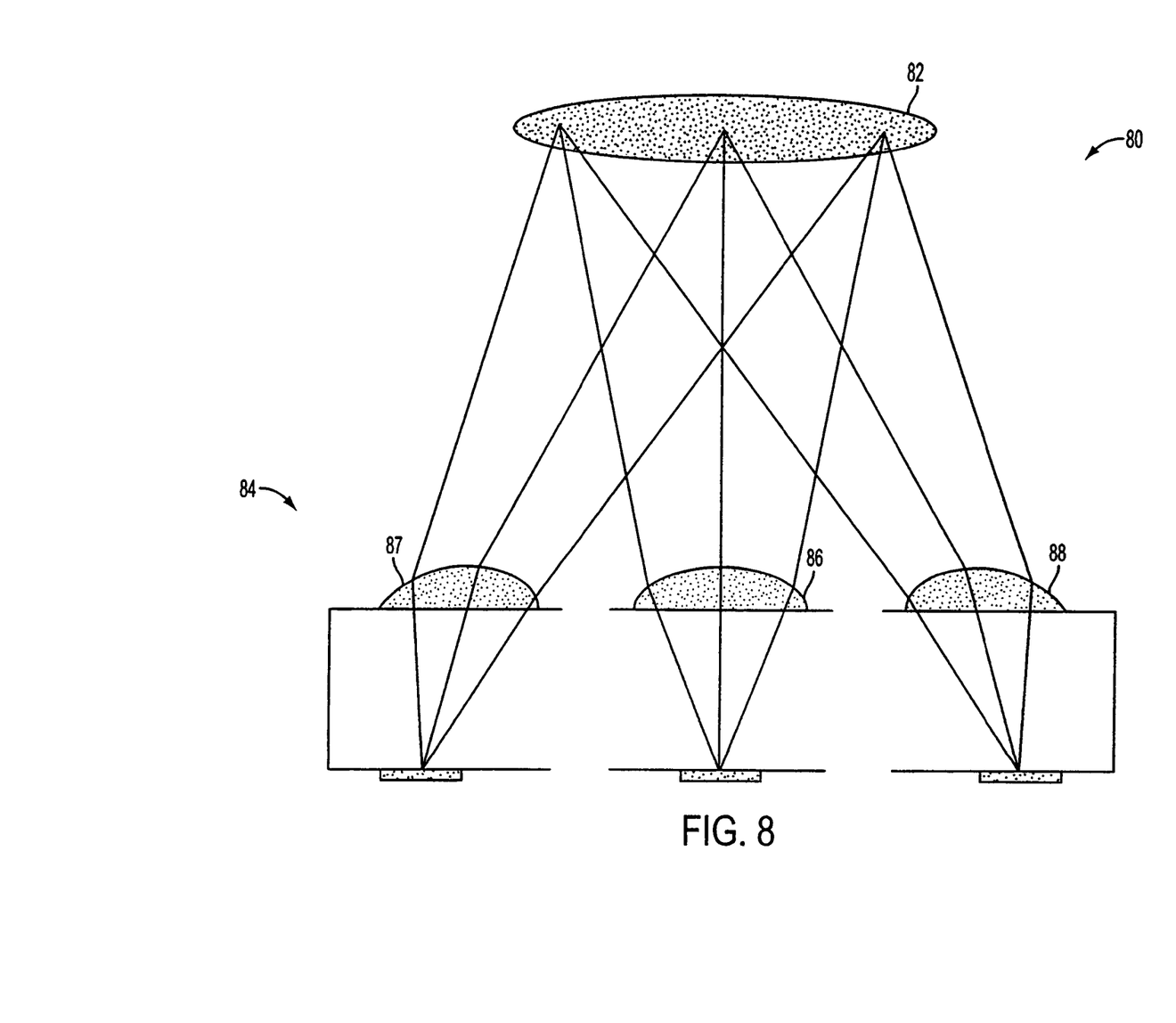
FIG. 8 is an elevation of a cellular telephone camera featuring a patterned microlens array according to an exemplary embodiment of the present invention.

FIG. 8 illustrates a practical application of modifying the focal angle of selected microlenses in a microlens array for use in a cellular telephone camera 80. A cellular telephone camera lens 82 is positioned in relation to a microlens array 84, which includes central microlens 86, left peripheral microlens 87, and right peripheral microlens 88. Additional microlenses located intermediate of the central and peripheral lenses 86, 87, 88, and additional structures such as a color filter array, are not shown for clarity. Due to the compactness of the cellular telephone camera 80, it is necessary for light focused through the camera lens 82 to spread at a relatively wide angle. Consequently, fight strikes peripheral microlenses 87, 88 at very flat angles as compared to light string central microlens 86. A microlens array made up entirely of central microlenses 86 would lose much of the image information that can now be captured by the peripheral microlenses 87, 88 because the low-angle light would not be focused properly toward an underlying photosensor. By forming peripheral microlenses 87, 88 with an off-axis (tilted) focal angle, as described above in connection with FIG. 7, incident light can be directed to impinge more directly on a photosensor associated with the peripheral microlenses, thereby reducing crosstalk and increasing photosensor signal toward the periphery of the microlens array.

In order to control the shape of the microlenses post-reflow, the microlens material is bleached pre-reflow by exposing patterned microlens blocks to UV radiation, for example. According to an exemplary embodiment, the microlens material is bleached using UV radiation at about 500 mJ. The UV radiation incident on the microlens material is patterned by a reticle positioned between the UV light source and the microlens material. The reticle is formed such that a pattern of UV light is projected onto the microlens material. Reticles can be of various types known in the art, including dual-tone types and variable transmission (gray pattern) types, the latter representing specialized mask technologies having apertures that transmit varying amounts of light. In variable transmission or gray tone photolithography, variable amounts of light are allowed to pass through apertures in the mask, in contrast with dual-tone photolithography in which apertures pass all of the light, and stops pass none of the light. Use of specialized masks, as well as multiple bleaching applications involving various masks, are contemplated by the present invention.

The reticles, or photomasks, are generally light masks with aperture stops and apertures that serve to convert a uniform light field to a spatially-patterned light field. Typically a reticle is a substantially flat glass substrate on which a pattern of chromium has been evaporated. The pattern of chromium defines the UV light field to be transmitted to the pre-reflow microlens array. FIGS. 9–18 illustrate reticles of various patterns that can be used in accordance with exemplary embodiments of the present invention. Although the reticle patterns illustrated in FIGS. 9–18 are regularly repeating patterns, any combination of patterns can be provided in a reticle so as to achieve varied application of the light field across a microlens array, for example. In each of the FIGS. 9–18 a dual-tone reticle is shown positioned over a microlens array. The patterned stop portion is formed by chrome deposited on a reticle substrate, such as glass. The microlens array in each of FIGS. 9–18 is represented by broken lines, located behind a reticle having apertures formed in a stop pattern indicated by shading. The invention is not limited to the dual tone reticles illustrated. Reticles based on other mask technologies, such as variable transmission masks, also can be used, as will be recognized by one of skill in the art.

Figure 9:
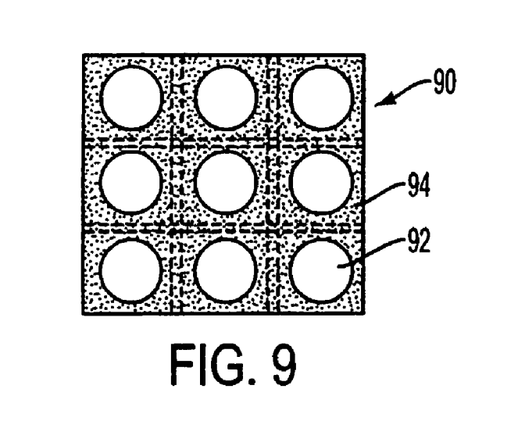
FIG. 9 illustrates a regular cell center bleaching pattern for a microlens array according to an exemplary embodiment of the present invention.
Figure 10:
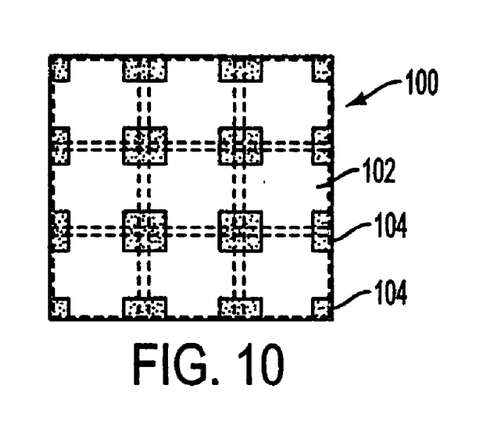
FIG. 10 illustrates a regular 1.5 μm block corners bleaching pattern for a microlens array according to an exemplary embodiment of the present invention.
Figure 11:
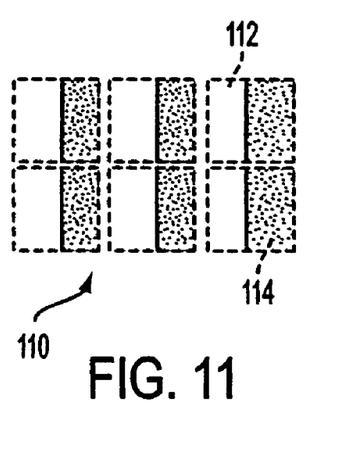
FIG. 11 illustrates a regular half sides bleaching pattern for a microlens array according to an exemplary embodiment of the present invention.
Figure 12:
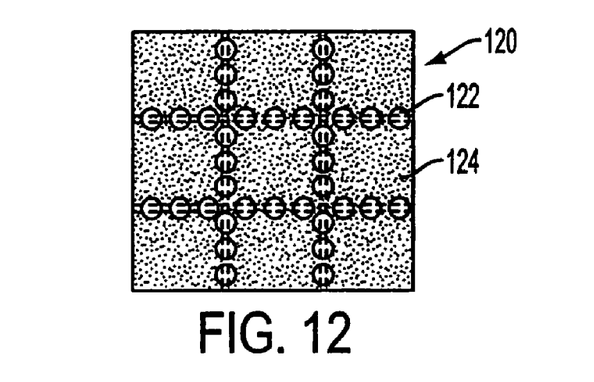
FIG. 12 illustrates a regular edges bleaching pattern for a microlens array according to an exemplary embodiment of the present invention.
Figure 13:
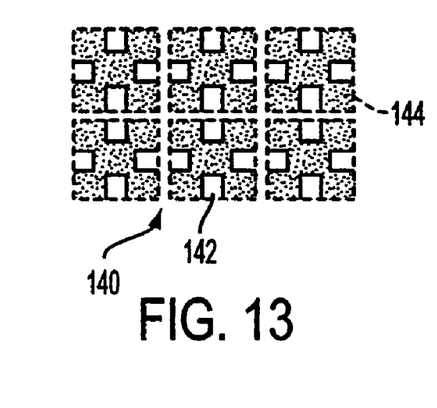
FIG. 13 illustrates a regular center of edges bleaching pattern for a microlens array according to an exemplary embodiment of the present invention.

FIG. 9 illustrates a reticle 90 that provides a pattern for bleaching the center of each microlens. UV light passes through circular apertures 92, and is blocked by a stop pattern 94. FIG. 10 illustrates a reticle 100 in which all but a 0.5 μm×1.5 μm block is bleached in each corner of the underlying microlenses. UV light passes through apertures 102, and is blocked by stop pattern 104. In FIG. 11, reticle 110 provides a pattern whereby one side of each microlens is bleached, as in the application illustrated in FIGS. 7 and 8. Reticle 110 features openings 112 formed in a stop pattern 114. FIG. 12 illustrates a reticle 120 by which an edge pattern is bleached for each microlens. Reticle 120 has small circular openings 122 formed in stop pattern 124. FIG. 13 illustrates a reticle 140 by which the middle of each edge of the microlenses is bleached through openings 142 formed in stop pattern 144.

Figure 14:
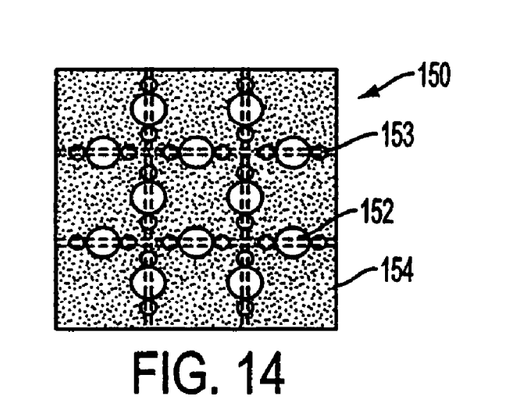
FIG. 14 illustrates an alternative center of edges bleaching pattern for a microlens array according to an exemplary embodiment of the present invention.
Figure 15:
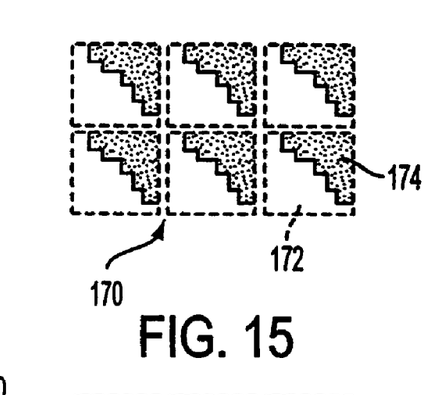
FIG. 15 illustrates a regular diagonal halves bleaching pattern for a microlens array according to an exemplary embodiment of the present invention.
Figure 16:
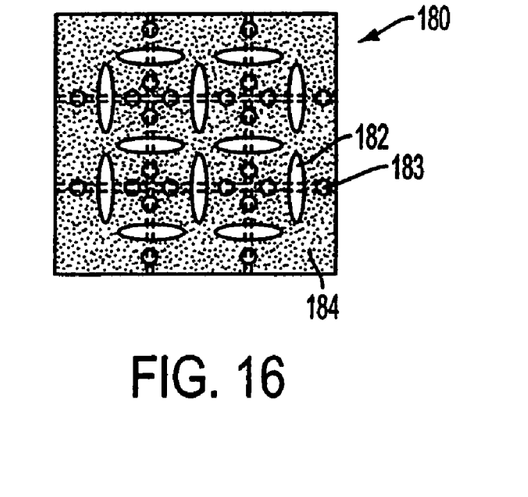
FIG. 16 illustrates an alternative center of edges bleaching pattern for a microlens array according to an exemplary embodiment of the present invention.
Figure 17:
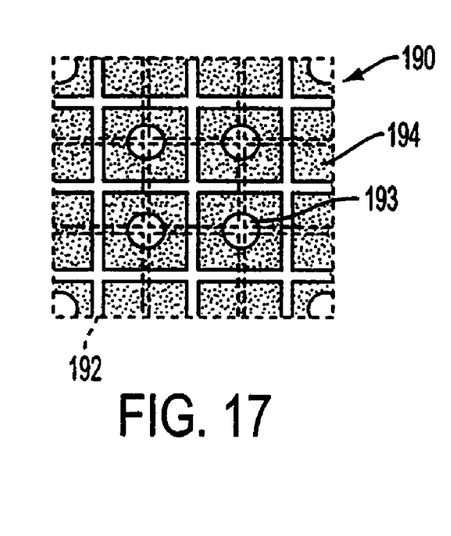
FIG. 17 illustrates a regular edges, centers, and corners bleaching pattern for a microlens array according to an exemplary embodiment of the present invention.
Figure 18:
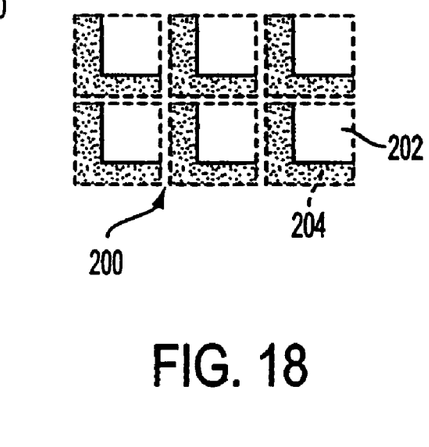
FIG. 18 illustrates a regular corner bleaching pattern for a microlens array according to an exemplary embodiment of the present invention.

FIG. 14 illustrates another reticle 150 by which the middle of each edge of the microlenses is bleached through large openings 152 and smaller openings 153 formed in stop pattern 154. FIG. 15 illustrates a reticle 170 by which a diagonal half of each microlens is bleached through openings 172 formed in stop pattern 174. FIG. 16 illustrates a reticle 180 by which an edge of each microlens is bleached through large elliptical openings 182 and small circular openings 183 formed in stop pattern 184. FIG. 17 illustrates a reticle 190 by which an edge, center, and corner of a microlens is bleached through linear openings 192 and circular openings 193 formed in stop pattern 194. FIG. 18 illustrates a reticle 200 by which a corner of each microlens is bleached through opening 202 formed in stop pattern 204.

Figure 19A:
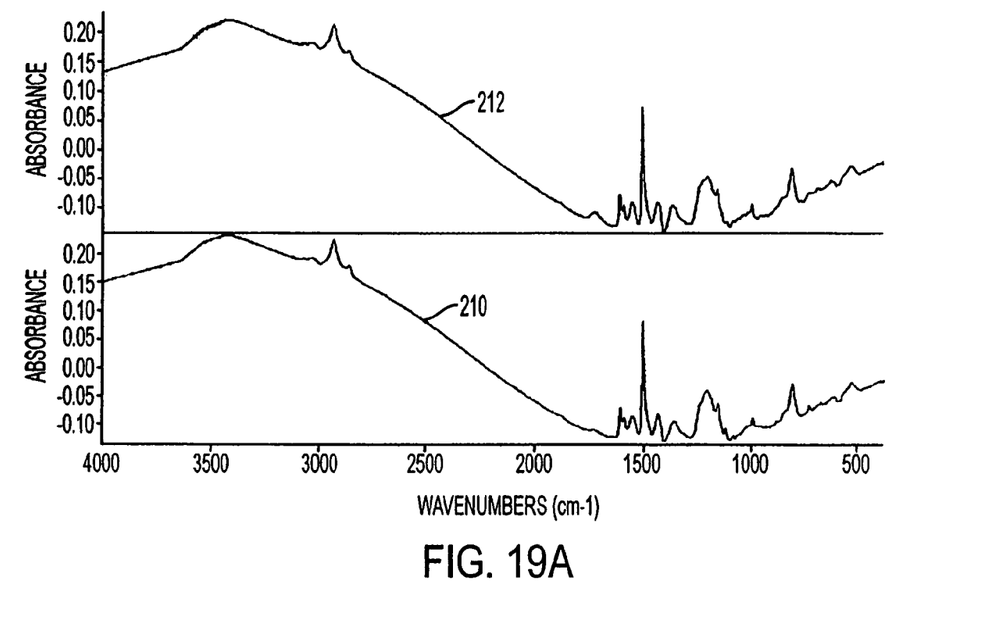
FIG. 19A is a pair of graphs illustrating the results of a transmission mode FT-IR comparison of bleached and unbleached photoresists.
Figure 19B:
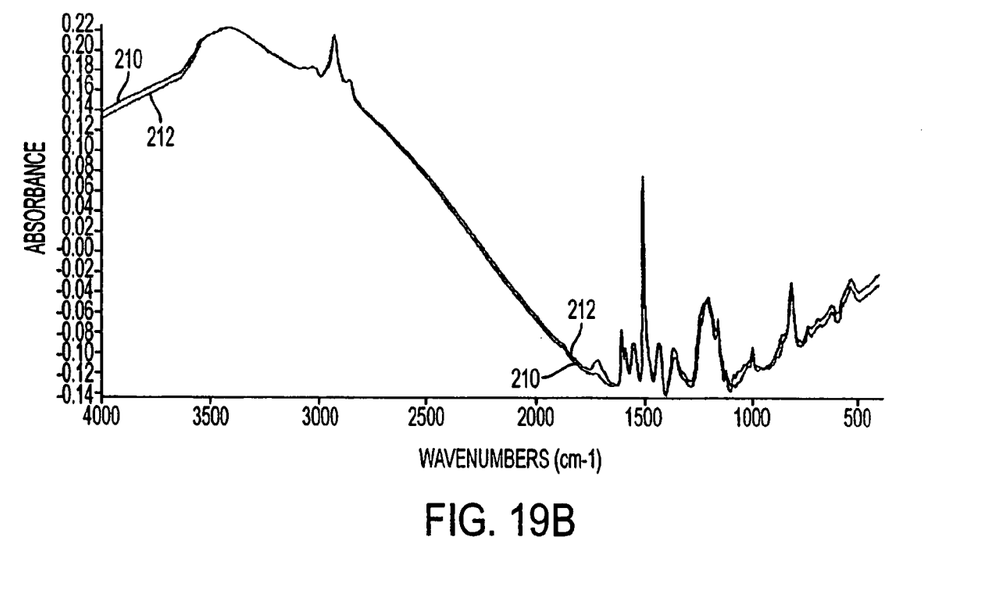
FIG. 19B is a composite graph illustrating the results shown in FIG. 21A.
Figure 19C:
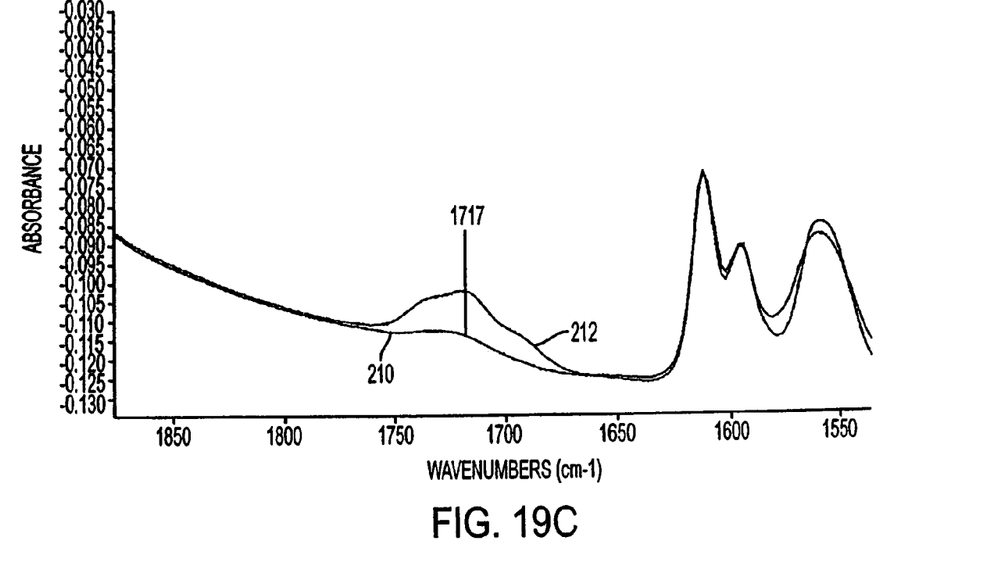
FIG. 19C is a scale-expanded graph of FIG. 21B near 1717 cm$^{-1}$.
Figure 19D:
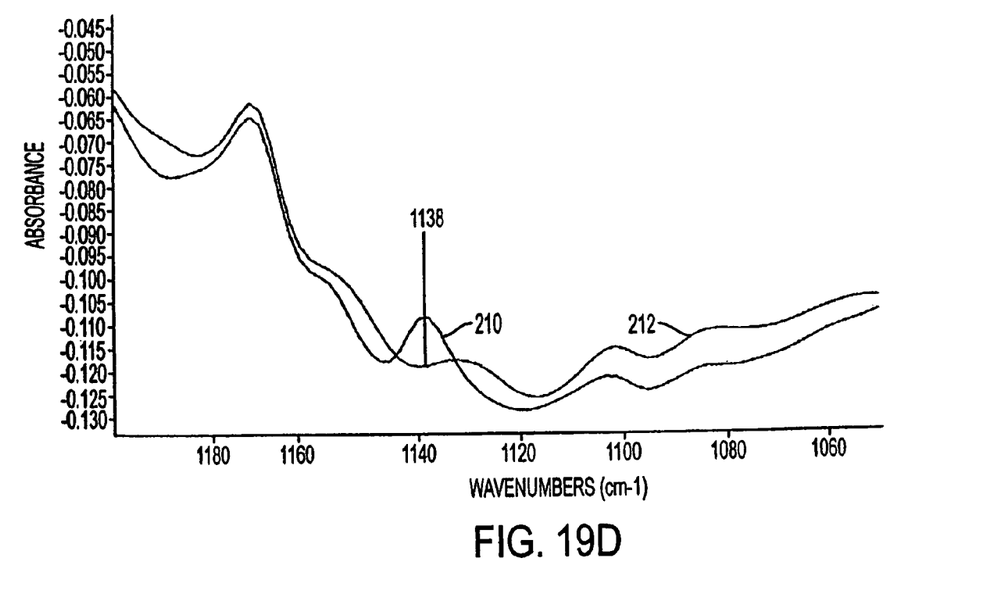
FIG. 19D is a scale-expanded graph of FIG. 21B near 1138 cm$^{-1}$.

FIGS. 19A–19D illustrate a comparison of infrared spectra (FT-IR) obtained from bleached and unbleached post-reflow microlens materials. Trace 210 is obtained from a bleached microlens material, and trace 212 is obtained from an unbleached microlens material. The bleached material (trace 210) was formed using a wafer coated with an approximately 1 μm layer of photoresist (JSR 401H2) which was UV exposed at 500 mJ and baked at 180° C. for 180 seconds (180/180). The unbleached material (trace 212) was formed using a wafer coated with photoresist (JSR 401H2) and was baked at 180/180 without being exposed. A band at approximately 1717 cm$^{-1}$, a region generally accepted to be a carbonyl band, is reduced significantly in the bleached material, and an unassigned band at approximately 1138 cm$^{-1}$ is created, indicating that the bleaching process produces changes in the chemical bond structure of the photoresist. FIG. 19A shows the two spectral traces 210 and 212 separately. FIG. 19B is a composite graph showing the two traces 210, 212 superimposed. FIG. 19C shows the spectra scale-expanded at the area around the 1717 cm$^{-1}$ carbonyl band. FIG. 19D shows scale expanded spectra at the area around the 1138 cm$^{-1}$ unassigned band. The comparison shows that the structure of the bleached (exposed) microlens material (trace 210) is altered as a result of the bleaching operation, whereby the shape of the post-reflow microlens (trace 212) is controlled.

Figure 20:
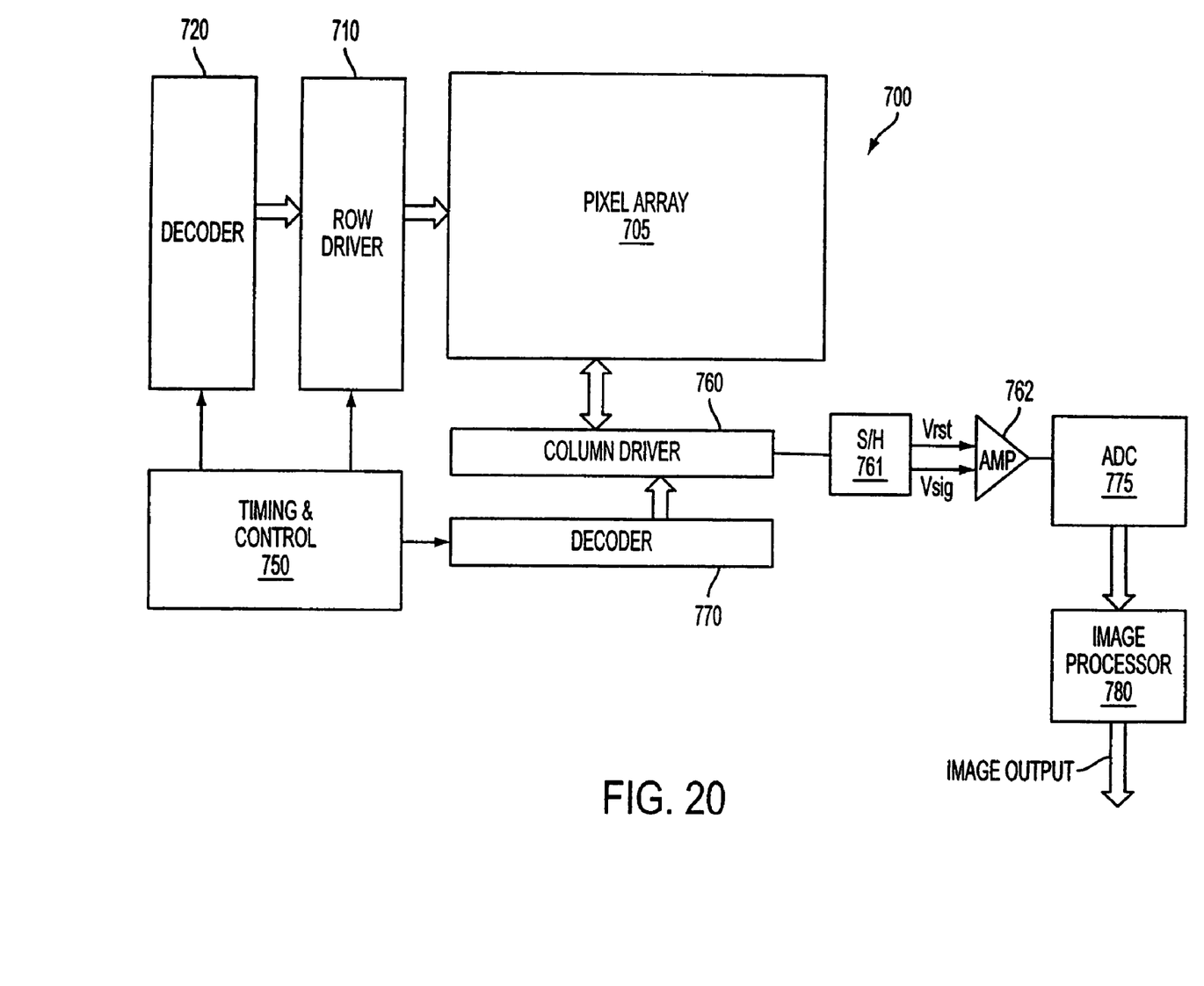
FIG. 20 is a diagram of a CMOS imager having a microlens array constructed in accordance with an exemplary embodiment of the invention.

FIG. 20 illustrates an exemplary imaging device 700 that may utilize the imager 22 (FIG. 2) constructed in accordance with the invention. The imaging device 700 has an imager pixel array 705 comprising pixels with microlens constructed as described above with reference to FIGS. 1–18. Row lines are selectively activated by a row driver 710 in response to row address decoder 720. A column driver 760 and column address decoder 770 are also included in the imaging device 700. The imaging device 700 is operated by the timing and control circuit 750, which controls the address decoders 720, 770. The control circuit 750 also controls the row and column driver circuitry 710, 760.

A sample and hold circuit 761 associated with the column driver 760 reads a pixel reset signal Vrst and a pixel image signal Vsig for selected pixels. A differential signal (Vrst−Vsig) is produced by differential amplifier 762 for each pixel and is digitized by analog-to-digital converter 775 (ADC). The analog-to-digital converter 775 supplies the digitized pixel signals to an image processor 780 which forms a digital image.

Figure 21:
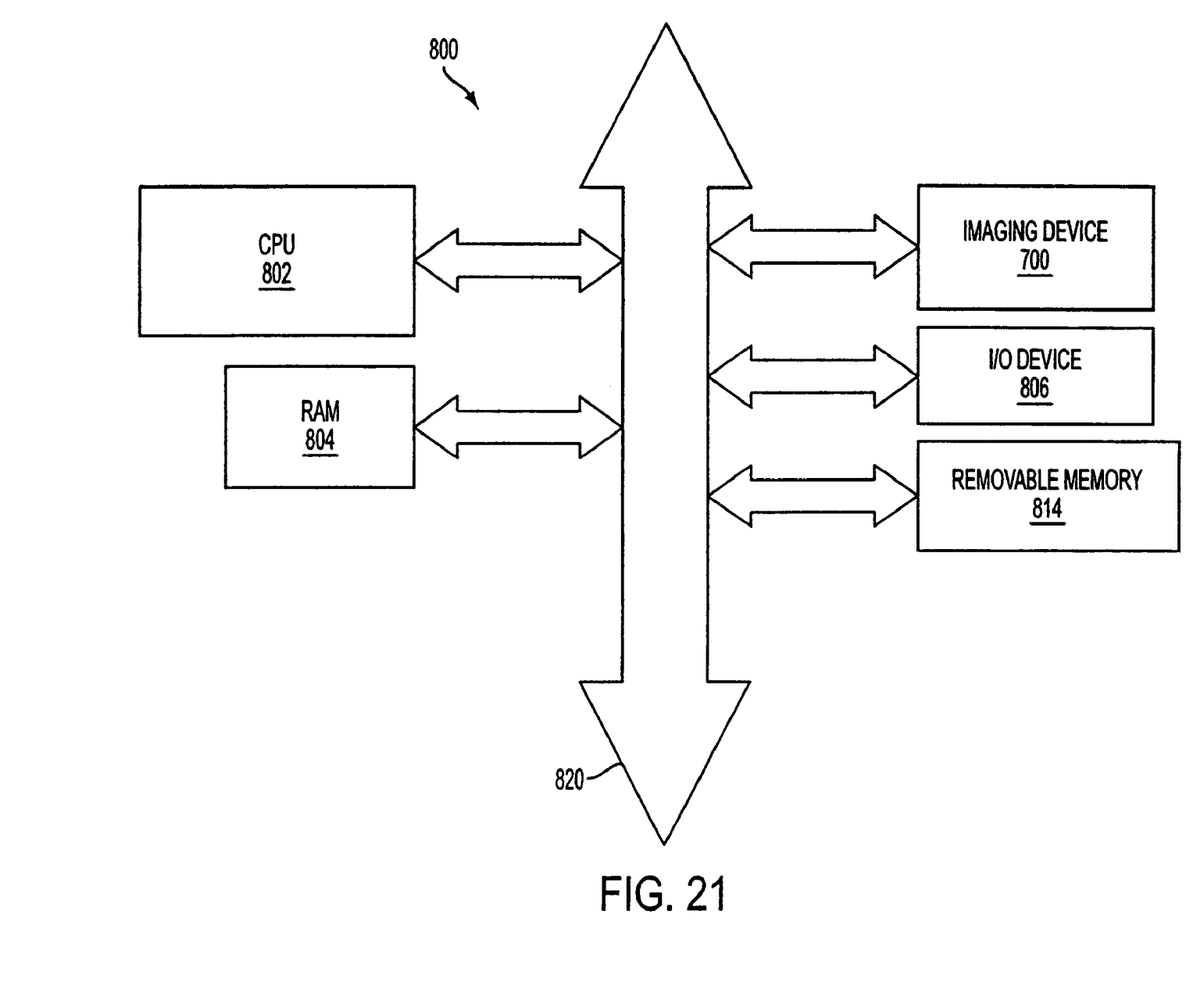
FIG. 21 shows a processor system incorporating at least one imaging device including a microlens array constructed in accordance with an embodiment of the invention.

FIG. 21 shows system 800, a typical processor system modified to include the imaging device 700 (FIG. 20) of the invention. The processor-based system 800 is exemplary of a system having digital circuits that could include image sensor devices. Without being limiting, such a system could include a computer system, still or video camera system, scanner, machine vision, vehicle navigation, video phone, surveillance system, auto focus system, star tracker system, motion detection system, image stabilization system, and data compression system.

System 800, for example a camera system, generally comprises a central processing unit (CPU) 802, such as a microprocessor, that communicates with an input/output (I/O) device 806 over a bus 820. Imaging device 700 also communicates with the CPU 802 over the bus 820. The processor-based system 800 also includes random access memory (RAM) 804, and can include removable memory 814, such as flash memory, which also communicate with the CPU 802 over the bus 820. The imaging device 700 may be combined with a processor, such as a CPU, digital signal processor, or microprocessor, with or without memory storage on a single integrated circuit or on a different chip than the processor.

Various applications of the methods of the invention will become apparent to those of skill in the art as a result of this disclosure. For example, a microlens having a spherical shape can be achieved by an appropriate bleaching pattern controlling the shape of the microlens reflow. Although certain advantages and embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A processor system, comprising:
a processor; and
an imager device coupled to said processor, the imager device comprising:
    a pixel cell array formed in a substrate, the pixel cell array having a plurality of pixel cells comprising a plurality of photosensors, and a microlens array over the plurality of photosensors, the microlens array comprising:
        a first set of bleached irradiation microlenses having a first shape; and
        a second set of bleached irradiation microlenses having a second shape different from the first shape.

2. A method of forming an imager device comprising:
providing a pixel cell array having a plurality of pixel cells, each pixel cell having a photosensor;
patterning a microlens material formed over the pixel cell array into a pre-reflow array;
irradiating the microlens material of the pre-reflow array through a pattern such that at least first and second portions of the microlens material are irradiated differently to produce at least a first and second set of pre-reflowed microlenses in an array, and
reflowing the pre-reflow array to form the microlens array having at least first and second sets of reflowed microlenses, the first set having different optical properties from the second set.

3. The method of claim 2, wherein the first set of reflowed microlenses have a first shape and the second set of reflowed microlenses have a second shape different from the first shape.

4. The method of claim 2, wherein the first set of reflowed microlenses have first focal characteristics and the second set of reflowed microlenses have second focal characteristics different from the first focal characteristics.

5. The method of claim 2 further comprising a third set of microlenses having optical properties different from the first and second optical properties.

6. The method of claim 5, wherein the first, second, and third optical properties comprise focal angle.

7. The method of claim 5, wherein the first, second, and third optical properties comprise focal length.

* * * * *

UNITED STATES PATENT AND TRADEMARK OFFICE
CERTIFICATE OF CORRECTION

PATENT NO. : 7,218,452 B2 Page 1 of 1
APPLICATION NO. : 11/384359
DATED : May 15, 2007
INVENTOR(S) : Ulrich Boettiger et al.

It is certified that error appears in the above-identified patent and that said Letters Patent is hereby corrected as shown below:

In the Specification, the following error is corrected:

Column 7, line 14, "string" should read --striking--.

Signed and Sealed this

Thirty-first Day of July, 2007

JON W. DUDAS
*Director of the United States Patent and Trademark Office*